United States Patent [19]

Calhoun et al.

[11] 3,877,051

[45] Apr. 8, 1975

[54] MULTILAYER INSULATION INTEGRATED CIRCUIT STRUCTURE

[75] Inventors: Harry C. Calhoun, Wappingers Falls; Larry E. Freed, Poughkeepsie; Carl L. Kaufman, Wappingers Falls, all of N.Y.

[73] Assignee: International Business Machines Corporation, Armonk, N.Y.

[22] Filed: Oct. 18, 1972

[21] Appl. No.: 298,729

[52] U.S. Cl. ...................... 357/15; 357/40; 357/51; 357/71; 29/578

[51] Int. Cl. ........................................ H01l 19/00

[58] Field of Search .. 317/235 B, 235 UA, 234 UA, 317/235 D; 357/15, 40, 51, 71

[56] References Cited

UNITED STATES PATENTS

| | | | |
|---|---|---|---|
| 3,419,765 | 12/1968 | Clark et al. | 317/234 |
| 3,452,219 | 6/1969 | Duryee | 307/272 |
| 3,463,975 | 8/1969 | Biard | 317/235 |
| 3,506,893 | 4/1970 | Dhaka | 317/235 |
| 3,536,965 | 10/1970 | Shurtleff | 317/234 |
| 3,558,992 | 1/1971 | Heuner et al. | 317/101 |
| 3,573,490 | 4/1971 | Sevin et al. | 307/221 |
| 3,575,732 | 4/1971 | Uhlir | 148/15 |
| 3,581,161 | 5/1971 | Cunningham et al. | 317/234 |
| 3,615,929 | 10/1971 | Portnoy et al. | 148/175 |
| 3,648,340 | 3/1972 | MacIver | 29/25.42 |

FOREIGN PATENTS OR APPLICATIONS

| | | | |
|---|---|---|---|
| 1,172,280 | 11/1969 | United Kingdom | 74/158 |

OTHER PUBLICATIONS

H. Yu, "Insulated Gate Field-Effect Transistor," I.B.M. Tech. Discl. Bull., Vol. 14, No. 1, June 1971, pp. 253, 254.

S. Krakauer et al., "Hot Carrier Diodes Switch in Picoseconds," Electronics, July 19, 1963, pp. 53–55.

*Primary Examiner*—Martin H. Edlow
*Assistant Examiner*—Joseph E. Clawson, Jr.
*Attorney, Agent, or Firm*—J. B. Kraft

[57] ABSTRACT

A planar semiconductor integrated circuit chip structure containing a planar surface from which a plurality of regions of different types and concentrations of conductivity-determining impurities extends into the chip to provide the active and passive devices of the circuit. The surface is passivated with an insulative structure containing at least two layers with a metallization pattern for interconnecting the integrated circuit devices formed on the first layer and via holes passing through the second or upper layer into contact with various portions of this metallization pattern. The via holes are arranged so that a majority of the holes are disposed above surface regions having such impurity types and concentrations that would form Schottky barrier contacts with the metal of contacts formed in said via holes. Accordingly, if during the formation of the via holes by etching through the second layer, there is an attendant further etching through the first layer to the surface of a semiconductor region, said region will form a Schottky barrier contact with the metal deposited in the via holes, which contact will act to prevent a short circuit between the metallization and the surface region.

16 Claims, 5 Drawing Figures

PRIOR ART

MULTILAYER INSULATION INTEGRATED CIRCUIT STRUCTURE

BACKGROUND OF INVENTION

The present invention relates to monolithic semiconductor planar integrated circuit structures which may be masterslices, and is particularly directed to integrated circuit structures having more than one layer of insulative material on the planar surface with via holes in the upper layer through which a metallization pattern on the lower layer is contacted.

Planar integrated semiconductor circuits, in general, comprise a plurality of active and passive devices formed at the planar surface of a semiconductor member which may conventionally be a semiconductor substrate supporting an epitaxial layer containing the planar surface. Since all of the P-N junctions in the integrated circuits extend from the planar surface, this planar surface is completely covered by a first layer of insulative material such as silicon dioxide in order to prevent exposure of the P-N junctions to the ambient and to electrically insulate the active and passive devices from an interconnecting metallization layer formed on the upper surface of this first layer. This metallization pattern interconnects the devices in the circuit and distributes to selected points in the circuit a plurality of voltage levels respectively from a plurality of voltage supplies. This metallization pattern is connected to appropriate device regions in the integrated circuit by means of electrical contacts passing through openings in the first insulative layer. Integrated circuits of the type described and appropriate methods for the fabrication thereof are disclosed in U.S. Pat. No. 3,539,876.

In a great many integrated circuits, it is further necessary to have a second layer of insulative material on the first layer. In the simpler integrated circuits, this layer is used primarily to cover and protect the metallization pattern. In more complex integrated circuits having a greater number of devices per unit area or greater device density, a second metallization pattern formed on the surface of the second insulative layer is often necessary because of insufficient area on the first insulative layer for a metallization pattern which is capable of making all of the required interconnections. In addition, the second metallization pattern on the second layer is used for metallization cross-overs. Integrated circuit structures having metallization patterns on the first and second layers are known as multilevel metallurgy integrated circuits.

In both the simpler integrated circuit structures wherein the second insulative layer is used primarily for protection and in the denser integrated circuits where the second layer supports a second metallization pattern, via holes through the second layer are required. In the simpler integrated circuits, such via holes are used primarily for the purpose of providing external contacts to the metallization pattern on the first layer. In the more complex circuits with multilevel metallization patterns, a great number of via holes are required in order to interconnect circuit nodes in the first layer metallization pattern with corresponding nodes on the second level metallization pattern.

The via holes through the second insulative layer are conventionally formed by etching. The etching process may be any conventional RF sputter-etching technique. Preferably, the etching is accomplished by conventional chemical etching of the insulative material, such as silicon dioxide, in the manner described in U.S. Pat. No. 3,539,876 which involves defining the via holes to be etched by standard photolithographic masking using a suitable photoresist layer and then etching with an appropriate etchant, e.g., buffered HF.

Since it has been conventional practice to utilize the same material for the first and second insulative layers, the problem of "over-etching" has been a significant one in the art. In chemical etching, the etchant utilized in forming the via holes in the second insulative layer will also attack the first insulative layer. This occurs even if the materials in the two insulative layers are not exactly the same material. For example, many of the conventional "glass" etchants will also attack to a greater or lesser extent other insulative materials which also fall into the "glass" category. Of course, if the etchant etches through the first layer beneath some of the via holes, undesirable short circuits will occur between the metallization on the first layer and the semiconductor substrate surface. With the increasing miniaturization of integrated circuits, the insulative layers are becoming thinner and it is becoming increasingly difficult to regulate etch times and rates so that only the second or upper insulative layer is etched through in forming via holes while the lower or first layer remains intact. Even with sputter etching where the etch rate is more easily controlled, the potential for etching through the first insulative layer under the via holes remains. With chemical etching, where etch rates are more difficult to control, potential for etching through the first insulative layer is very significant.

The prior art has considered many possible solutions to the problem of such etch-through in the first insulative layer. One approach involves utilizing for the first insulative layer a material which has a much greater resistance to the etchant than does the second layer being etched. For example, where the second layer is silicon dioxide, a lower silicon nitride layer will display increased resistance to many etchants for silicon dioxide. One problem with the use of silicon nitride is that its adhesion to semiconductor substrates such as silicon is less than completely satisfactory. Consequently, when silicon nitride is used beneath the second insulative layer as a barrier to the etchant, an additional layer of silicon dioxide has to be used between the silicon nitride and the substrate. In cases where a silicon nitride/-silicon dioxide composite is required for the first layer because of other integrated circuit requirements such as passivation, the use of such a composite as the first layer provides an excellent solution to the problem of over-etching in forming the via holes. However, where the nature of the integrated circuit is such that such a layer is not required for passivation or other reasons, the use of the additional silicon nitride layer merely as an etching barrier requires the utilization of an additional layer together with the attendant alignment and processing steps.

Another approach which has been used in the art to prevent etch-through of the first layer in forming via holes is shown in FIGS. 1 and 1A. In these structures, in the areas immediately beneath the via holes in the second layer, the underlying metallization has expanded dimensions so as to form a metallic pad directly beneath the via holes. With such an arrangement, even if there is some misalignment of the via holes with respect to the underlying metallization, the pad has such expanded dimensions that the metallization will be completely coextensive even with a misaligned via hole and, therefore, no portion of the first layer underlying the via hole would be exposed to the etching medium which is forming the hole. Since the underlying metal is resistent to the etching medium, the first layer would be protected and there would be no etch-through. In FIGS. 1 and 1A, we have first insulative layer 10 and second insulative layer 11 formed of silicon dioxide, metallization pattern 13 with expanded pad 14 directly under via hole 15. While this approach to the problem of preventing etch-through is relatively satisfactory with less dense integrated circuits, in the case of the more complex integrated circuits which have a great many devices in a relatively small area and, consequently, a very dense metallization pattern on the first layer, the use of expanded protective pads of metal beneath the via holes occupies valuable real estate which restricts the metallization density of the pattern on the first layer.

SUMMARY OF THE INVENTION

Accordingly, it is a primary object of the present invention to provide a planar semiconductor integrated circuit having a plurality of insulative layers and via holes which is free from the effects of etch-through in the lower insulative layer as a result of via hole formation in the upper insulative layer.

It is another object of the present invention to provide a planar integrated circuit chip structure with a plurality of insulative layers of substantially the same material and via holes through an upper layer which is substantially free of the effects of etch-through in the lower layer.

It is a further object of the present invention to provide a planar semiconductor integrated circuit structure which fulfills the above objects without limiting the density of metallization pattern beneath the layer in which the via holes are formed.

It is yet a further object of the present invention to provide an integrated circuit chip structure in which the effects of misalignment of the via holes in the upper insulative layer with respect to the metallization pattern on the lower insulative layer is minimized while the density of wiring in said metallization pattern is maximized.

The present invention solves the problem of over-etching through the first or lower insulative layer by an approach which does not involve the use of any additional etchant "barrier" layer or of expanded metallization pads. Rather, it provides a structure and method wherein no attempt is made to prevent or limit such over-etching.

The present invention provides a planar semiconductor integrated circuit structure which comprises a planar surface from which a plurality of regions of different types and concentrations of conductivity-determining impurities extend into the chip to provide the active and passive devices of the circuit, a first layer of insulative material covering such surface, a plurality of electrical contacts extending through openings in said insulative layer respectively to the regions in the substrate, a metallization pattern formed on said first insulative layer connected to the contacts, a second layer of insulative material covering the first layer, said second layer having a plurality of via holes extending through it, and a plurality of metallic electrical contacts to the metallization pattern formed in these via holes. These via holes are uniquely disposed so that a majority and, preferably, substantially all of the via holes are disposed above surface regions having such impurity types and concentrations that would form Schottky barrier contacts with the metals in the via holes if the metals were to contact the regions as a result of etch-through in the first insulative layer.

By such an arrangement of the via holes, the results of over-etching through the first layer can substantially be ignored in that any resulting Schottky barrier contacts would act as rectifying contacts to prevent any short circuit between the metallization and the underlying substrate.

In accordance with another aspect of the present invention, there is provided a structure in which etch-through in the first insulative layer under the via holes is standard because the via holes have greater horizontal dimensions than the metallization beneath the via holes.

The foregoing and other objects, features and advantages of the invention will be apparent from the following more particular description and preferred embodiments of the invention as illustrated in the accompanying drawings.

BRIEF DESCRIPTION OF THE DRAWINGS

FIG. 1 is an illustrative top view of a portion of a planar surface of an integrated circuit chip illustrating the prior art utilization of metallization pads as an expedient for preventing etch-through.

DESCRIPTION OF THE PREFERRED EMBODIMENTS

Figure 1:
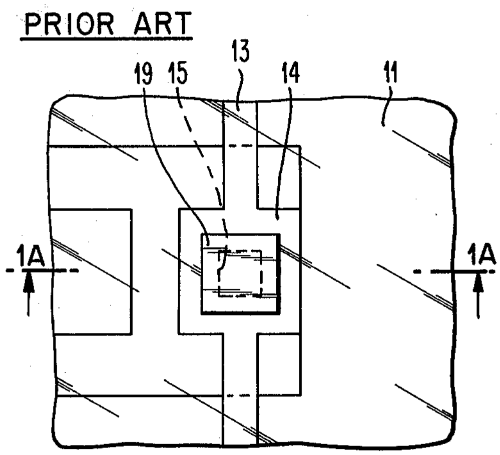
Figure 1A:
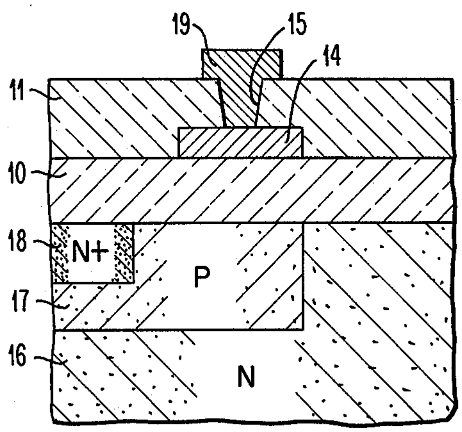
FIG. 1A is a diagrammatic cross-section along line 1A, 1A of FIG. 1.

It has been previously mentioned, FIG. 1 of the structure in FIG. 1 and FIG. 1A illustrates a standard expedient utilized in the prior art for preventing etch-through of the first layer. The structure comprises a substrate 16 having appropriate device regions 17 and 18 diffused therein. There is a first insulative layer 10 on the surface of the semiconductor substrate. There is a metallization pattern 13 formed on the surface of the first insulative layer. Between the metallization pattern on the first layer and regions in the substrate, there are contacts passing through holes in layer 10 which are not shown. In order to prevent any short circuits between the metallization 19 in the second insulative layer 11 from penetrating through the first insulative layer 10 to contact the surface of semiconductor substrate 16, a portion of the metallization directly beneath via hole 15 is expanded into a pad 14 which is sufficient in size to assure that even if there is a misalignment of a via hole 15, the lower portion of the via hole will be completely blocked by pad 14. Since the metal in pad 14 is resistant to the chemical etchant used for the via holes, there is no possibility of over-etching through insulative layer 10 since insulative layer 10 will not be exposed to the via hole during the etching of the via hole. In the illustration of FIG. 1A, substrate 16 is silicon and insulative layers 10 and 11 are silicon dioxide.

The prior art structure of FIGS. 1 and 1A is very effective in preventing etch-through in the first insulative layer. However, because of the expanded dimensions of metallic pad 14, the wiring density on metallization pattern 13 on the first insulative layer cannot be high because expanded pads 14 occupy a great deal of "real estate," particularly in structures which have great many via holes.

Figure 2:
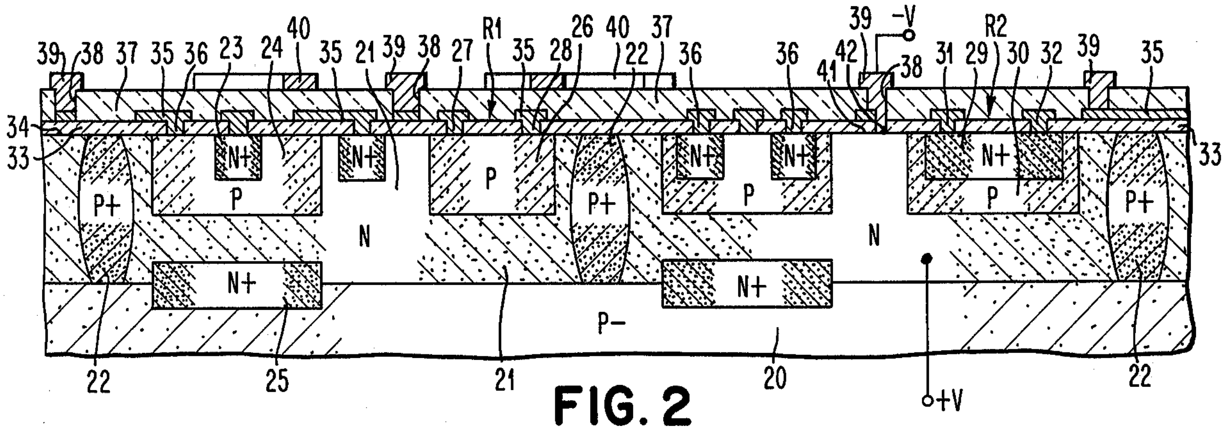
FIG. 2 is a diagrammatic cross-sectional view of an integrated circuit of a portion of an integrated circuit chip in accordance with the present invention.

An embodiment of the present invention is shown in FIG. 2. The structure of FIG. 2 is quite similar in its general aspects to the integrated circuit structure described in U.S. Pat. No. 3,539,876 and may be conveniently fabricated in accordance with the process set forth in said patent. The structure comprises P- substrate 20 having formed thereon an N type epitaxial layer 21. Active and passive devices are formed in the epitaxial layer preferably by diffusion and are isolated from one another by P+ isolation regions 22. A typical transistor comprises emitter region 23, base region 24 and subcollector region 25. Typical resistors in the circuits are resistors R1 which comprises a P region 26 with a pair of contacts, 27 and 28, thereto. R2 is another typical resistor which comprises N+ region 29 isolated by P region 30 with a pair of contacts, 31 and 32, to region 29.

A first insulative layer of silicon dioxide 33 is formed over the planar surface 34 of the integrated circuit. A first level metallization pattern 35 is formed on the surface of insulative layer 33. Metallization pattern 35 which is connected to the various regions in the active and passive devices of the substrate through contacts 36 serves to interconnect these regions. A second insulative layer of silicon dioxide 37 is formed over layer 33. A plurality of via holes pass through layer 37. Via hole contacts 39 in these via holes extend into contact with various points in the metallization pattern 35 beneath the via holes.

The via holes 38 are formed by chemical etching of insulative layer 37 using the conventional photolithographic etching techniques described in Pat. No. 3,539,876. In other words, after the metallization pattern is formed on the first insulative layer 33, the second insulative layer 37 is applied. This second layer of silicon dioxide may be applied utilizing the sputtering techniques described in U.S. Pat. No. 3,539,876. The via holes 38 may then be etched using suitable photolithographic masking and an etchant such as buffered HF. As shown in FIG. 2, via holes 38 are disposed so that each is completely over N type epitaxial region 21. Epitaxial region 21 has an impurity concentration with a maximum $C_0$ of $10^{18}/cm^3$ and preferably impurity concentration in the order of $5 \times 10^{16}/cm^3$.

The metal utilized for the via hole contacts 39 must be one which is capable of forming a Schottky barrier contact with epitaxial layer 21. For the present embodiment, metals such as aluminum or platinum silicide may be used. However, a wide variety of metals suitable to form such Schottky barrier contacts are well known to those skilled in the art. They include metals such as platinum, palladium, chromium, molybdenum, or nickel among others. The second metallurgy pattern 40 is then formed on the surface of insulative layer 37. The second metallurgy pattern is connected to various nodes in the first metallurgy pattern through via hole contacts 39. With the disposition of the via holes as described, if any of the via holes are misaligned with respect to the underlying metallurgy as is the case at point 41, there is an excellent possibility that when the via hole is etched, the etchant will over-etch through the first layer to make a contact 42 with the surface of epitaxial layer 21. This contact, however, will be a Schottky barrier contact which will act as a rectifying contact preventing shorts between metallurgy patterns and the substrate. In order to insure this rectifying action of the Schottky barrier contact, the potential level applied to the metal which extends into contact with the surface and that applied to the surface must be such that there will be a potential difference applied across the Schottky barrier contact sufficient to reverse bias the contact. With the integrated circuit shown, this reverse biasing is readily accomplished; it is conventional practice in the circuit shown to maintain the N type epitaxial layer at a positive potential level, +V, during the operation of the circuit. Then, if the metallurgy in contact with the via holes is maintained at the other standard operating level, −V, suitable reverse biasing of any Schottky barrier contact which may occur will be assured. In FIG. 2, the +V and −V potential levels have been shown as applied diagrammatically. In actual circuit operation, these levels will be applied through the power supply distribution accomplished through the metallurgy and appropriate contacts to the substrate.

Figure 3:
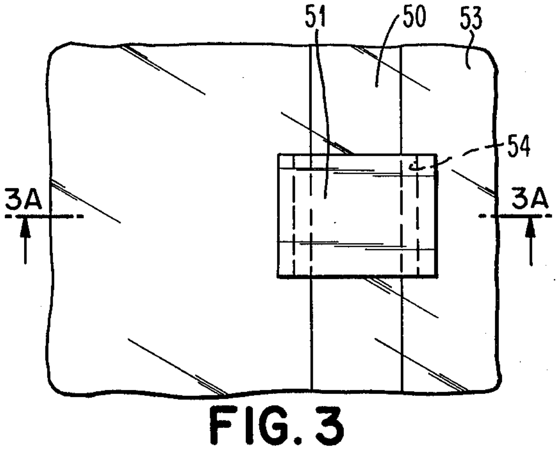
FIG. 3 is a diagrammatic plan view of a portion of a surface of a chip illustrating another embodiment of the present invention.
Figure 3A:
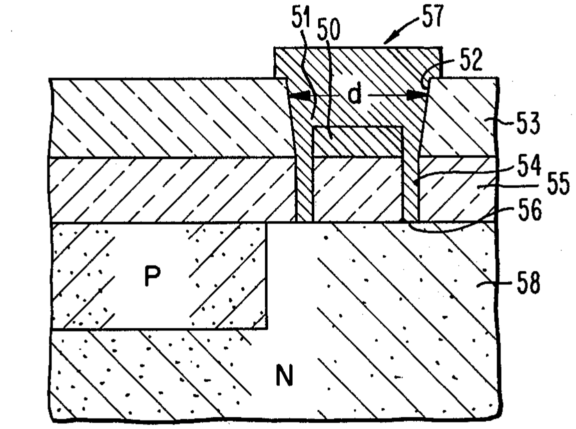
FIG. 3A is a diagrammatic cross-sectional view taken along line 3A, 3A of FIG. 3.

Another aspect of the present invention is shown in FIGS. 3 and 3A. With the structure shown in FIG. 2, when a misalignment occurs, as at point 41, the contact 39 in the via hole will not completely contact the whole surface area of the underlying metallurgy. Thus, there will be only a partial contact. With less complex integrated circuitry, such a partial contact will usually be sufficient in that whatever increased contact resistance results from this partial contact will have no effect on the operating circuit parameters. However, with the more complex integrated circuits of increasing density, a partial contact such as that in FIG. 2 may introduce a resistance element which adversely affects the operation of the circuitry. Under such circumstances, the expedient shown in FIGS. 3 and 3A serves to insure that a total contact is made to underlying metallurgy 50 by via hole contact 51 formed in via hole 52. Via hole 52 has a horizontal dimension, d, greater than that of metallurgy 50. Thus, when via hole 51 is formed by chemical etching through silicon dioxide layer 53, there will be over-etching which will result in an opening 54 through lower $SiO_2$ layer 55 in the regions of the via holes which metal 50 is not beneath. This will result in a Schottky barrier contact 56, having the characteristics previously described with respect to FIG. 2, between the metallurgy 57 of the via hole contact and N epitaxial region 58. Since, as previously described, these Schottky barrier contacts serve to prevent any short circuits between the metallurgy and the substrate, the metallurgy still remains electrically isolated from the substrate by the rectifying contact. However, since metal 50 is completely covered by contact metallurgy 57, the result is a complete rather than partial contact.

While there has been described in the preferred embodiments Schottky barrier contacts formed with an N type substrate, it will be recognized by those skilled in the art that the principles of the present invention can also be applied where a P type substrate having a maximum $C_0$ of $10^{18}/cm^3$ merely by using suitable metals which form Schottky barrier contacts with such substrates. These metals include aluminum, gold, copper and nickel.

While the invention has been particularly shown and described with reference to preferred embodiments thereof, it will be understood by those skilled in the art that the foregoing and other changes in form and details may be made therein without departing from the spirit and scope of the invention.

What is claimed is:

1. In a planar semiconductor integrated circuit chip structure comprising a planar surface from which a plurality of regions of different types and concentrations of conductivity-determining impurities extend into the chip to provide the active and passive devices of the circuit, a first layer of insulative material covering said surface, a plurality of electrical contacts extending through openings in said insulative layer respectively to said regions, a metallization pattern formed on said first insulative layer connected to said contacts, a second layer of insulative material covering said first layer, said second layer having a plurality of via holes extending therethrough, and a plurality of metallic electrical contacts to said metallization pattern formed in and coextensive with said via holes, the improvement wherein the majority of the via holes in said second layer are disposed above surface regions having such impurity types and concentrations that would form Schottky barrier contacts with the type of metal of the contacts formed in the via holes, and said majority of the via holes have a horizontal dimension at least equal to the horizontal dimension of the metallization directly below said majority of the via holes.

2. The integrated circuit structure of claim 1 wherein substantially all of the via holes are disposed above surface regions having impurity types and concentrations such that would form Schottky barrier contacts with the type of metal of the contacts formed in the via holes.

3. The integrated circuit structure of claim 2 wherein the surface regions above which said via holes are disposed have a maximum impurity $C_0$ of $10^{18}/cm^3$.

4. The integrated circuit structure of claim 3 wherein the regions above which said via holes are disposed are N type regions.

5. The integrated circuit structure of claim 4 wherein said planar surface is the surface of an N type epitaxial layer, and the N type regions above which the via holes are disposed are portions of said epitaxial layer proper.

6. In a planar semiconductor integrated circuit chip structure comprising a planar surface from which a plurality of regions of different types and concentrations of conductivity-determining impurities extend into the chip to provide the active and passive devices of the circuit, a first layer of insulative material covering said surface, a plurality of electrical contacts extending through openings in said insulative layer respectively to said regions, a metallization pattern formed on said first insulative layer connected to said contacts, a second layer of insulative material covering said first layer, said second layer having a plurality of via holes extending therethrough, and a plurality of metallic electrical contacts to said metallization pattern formed in and coextensive with said via holes, the improvement wherein at least one of said via holes has a horizontal dimension at least equal to the horizontal dimension of the metallization of said first layer directly below said at least one of said via holes and further extends through said first layer, and the metallic contact in said via hole extends into contact with a region at said surface directly below said via hole, said region having an impurity type and concentration such that said metallic contact forms a Schottky barrier contact with said surface region.

7. The integrated circuit structure of claim 6 wherein said surface region with which the Schottky barrier contact is made has a maximum $C_0$ of $10^{18}/cm^3$.

8. The integrated circuit structure of claim 7 wherein said surface region with which the Schottky carrier contact is made is an N type region.

9. The integrated circuit structure of claim 6 wherein substantially all of the via holes are disposed above surface regions having impurity types and concentrations such that would form Schottky barrier contacts with the type of metal of the contacts formed in the via holes.

10. The integrated circuit structure of claim 9 wherein the surface regions above which said via holes are disposed have a maximum impurity $C_0$ of $10^{18}/cm^3$.

11. The integrated circuit structure of claim 10 wherein said planar surface is the surface of an N type epitaxial layer, and the N type regions above which the via holes are disposed are portions of said epitaxial layer proper.

12. In a planar semiconductor integrated circuit chip structure comprising a planar surface from which a plurality of regions of different types and concentrations of conductivity-determining impurities extend into the chip to provide the active and passive devices of the circuit, a first layer of insulative material covering said surface, a plurality of electrical contacts extending through openings in said insulative layer respectively to said regions, a metallization pattern formed on said first insulative layer respectively connecting each of a plurality of voltage supplies having different levels to different regions through said contacts during the operation of the integrated circuit, a second layer of insulative material covering said first layer, said second layer having a plurality of via holes extending therethrough, and a plurality of metallic electrical contacts to said metallization pattern formed in said via holes, the improvement wherein the majority of the via holes in said second layer are disposed above surface regions having such impurity types and concentrations that would form Schottky barrier contacts with the type of metal of the contacts formed in the via holes, and the voltage levels respectively applied to metallization contacting the via hole contacts and to the said surface regions above which the via holes are disposed would be sufficient to reverse bias said Schottky barrier contacts and said majority of the via holes have a horizontal dimension at least equal to the horizontal dimension of the metallization directly below said majority of the via holes.

13. The integrated circuit structure of claim 12 wherein the surface regions above which the via holes are disposed have a maximum $C_0$ of $10^{18}/cm^3$.

14. The integrated circuit structure of claim 13 wherein said planar surface is the surface of an N type epitaxial layer, and the N type regions above which the via holes are disposed are portions of said epitaxial layer proper.

15. The integrated circuit structure of claim 13 wherein substantially all of the via holes are disposed above surface regions having impurity types and concentrations such that would form Schottky barrier contacts with the type of metal of the contacts formed in the via holes.

16. The integrated circuit structure of claim 1 wherein said first and second layers comprise substantially the same material.

* * * * *